(12) United States Patent
Chen et al.

(10) Patent No.: US 7,541,624 B2
(45) Date of Patent: Jun. 2, 2009

(54) FLAT PROFILE STRUCTURES FOR BIPOLAR TRANSISTORS

(75) Inventors: Young-Kai Chen, Berkeley Heights, NJ (US); Rose Fasano Kopf, Green Brook, NJ (US); Wei-Jer Sung, Hsinchu (TW); Nils Guenter Weimann, Chatham, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 487 days.

(21) Appl. No.: 10/624,038

(22) Filed: Jul. 21, 2003

(65) Prior Publication Data
US 2005/0032323 A1    Feb. 10, 2005

(51) Int. Cl.
*H01L 21/00*    (2006.01)

(52) U.S. Cl. .................. 257/197; 257/200; 257/201; 257/592; 257/623

(58) Field of Classification Search ............... 257/197, 257/200–201, 571, 586, 592, 623
See application file for complete search history.

(56) References Cited

U.S. PATENT DOCUMENTS

| | | | | |
|---|---|---|---|---|
| 4,962,053 A * | 10/1990 | Spratt et al. | ............ | 438/202 |
| 5,096,844 A * | 3/1992 | Konig et al. | ............ | 438/348 |
| 5,444,003 A * | 8/1995 | Wang et al. | ............ | 438/202 |
| 5,459,084 A | 10/1995 | Ryum et al. | ............ | 437/31 |
| 5,465,006 A * | 11/1995 | Chen | ............ | 257/557 |
| 5,481,120 A * | 1/1996 | Mochizuki et al. | ............ | 257/49 |
| 5,494,836 A * | 2/1996 | Imai | ............ | 438/312 |
| 5,500,554 A * | 3/1996 | Sato | ............ | 257/588 |
| 5,506,427 A * | 4/1996 | Imai | ............ | 257/197 |
| 5,696,007 A | 12/1997 | Ryum et al. | ............ | 437/132 |
| 5,710,452 A | 1/1998 | Narita | ............ | 257/355 |
| 5,798,277 A | 8/1998 | Ryum et al. | ............ | 437/31 |
| 5,903,018 A * | 5/1999 | Shimawaki | ............ | 257/198 |
| 6,190,984 B1 | 2/2001 | Ryum et al. | ............ | 438/309 |
| 6,198,139 B1 | 3/2001 | Ishida | ............ | 257/372 |
| 6,337,494 B1 | 1/2002 | Ryum et al. | ............ | 257/197 |
| 6,362,066 B1 | 3/2002 | Ryum et al. | ............ | 438/364 |
| 6,436,781 B2 | 8/2002 | Sato | ............ | 438/350 |
| 6,541,346 B2 * | 4/2003 | Malik | ............ | 438/316 |
| 6,960,820 B2 * | 11/2005 | Freeman et al. | ............ | 257/586 |

OTHER PUBLICATIONS

Definition of "sub" (definition 2b), Merriam-Webster's Collegiate Dictionary, Tenth Edition, 1993.*
U.S. Appl. No. 10/243,369, filed Sep. 13, 2002, Y. Chen et al.

* cited by examiner

*Primary Examiner*—Eugene Lee
(74) *Attorney, Agent, or Firm*—John F. McCabe

(57) ABSTRACT

A method for fabricating a bipolar transistor includes forming collector, base, and emitter semiconductor layers on a substrate such that the layers form a vertical sequence with respect to an adjacent surface of the substrate. The method includes etching away a portion of a top one of the semiconductor layers to expose a portion of the base semiconductor layer and then, growing semiconductor on the exposed portion of the base layer. The top one of the semiconductor layers is the layer of the sequence that is located farthest from the substrate. The growing causes grown semiconductor to laterally surround a vertical portion of the top one of the semiconductor layers.

14 Claims, 10 Drawing Sheets

FLAT PROFILE STRUCTURES FOR BIPOLAR TRANSISTORS

This invention was made with Government support under Contract No. MDA972-03-C-0027 awarded by DARPA. The Government has certain rights in this invention.

BACKGROUND

1. Field of the Invention

The invention relates generally to thin film devices and, more particularly, to thin film bipolar transistors.

2. Discussion of the Related Art

The active semiconductor layers of some bipolar transistors are vertically stacked normal to the surface of the substrate on which the transistor rests. The vertical stacking produces a nontrivial cross-sectional profile for the transistor.

Such vertical stacking is illustrated by the triple mesa structure 10 shown in FIG. 1. The triple mesa structure 10 includes a series of semiconductor layers that includes emitter, base, and collector layers 11-13 and a heavily doped subcollector layer 14. The series forms a vertical stack on top surface 15 of a semiconductor substrate 16. The triple mesa structure 10 also includes electrical contacts 17, 18, and 19 for the emitter, base, and subcollector, respectively. In an integrated circuit (IC), a protective dielectric layer 9 covers the triple mesa structure 10.

In the triple mesa structure 10, vertically stacking of semiconductor layers can lead to undesirable properties. First, the structure often provides poor dissipation of heat during transistor operation. Second, the structure often reduces adhesion of the protective dielectric layer 9 to the underlying substrate 16. It is desirable to have structures for bipolar transistors with improved properties.

BRIEF SUMMARY

Various embodiments provide vertical structures for bipolar transistors having more planar profiles than the triple mesa structure. In the new vertical structures, semiconductor of the base layer, at least, partially surrounds the top most active semiconductor layer of the bipolar transistor. This aids to dissipate heat, which is produced in the top most active semiconductor layer, through the thermally conductive semiconductor of the base layer. This also produces a more planar cross-sectional profile for the combined emitter and base layers thereby aiding in the adhesion of overlying dielectric to the substrate.

One embodiment features a method for fabricating a bipolar transistor. The method includes forming collector, base, and emitter semiconductor layers on a substrate such that the layers form a vertical sequence with respect to the adjacent surface of the substrate. The method includes etching away a portion of a top one of the semiconductor layers to expose a portion of the base semiconductor layer. The top one of the semiconductor layers is the layer of the sequence that is located farthest from the substrate. The method also includes growing semiconductor on the exposed portion of the base layer. The growing step produces semiconductor that laterally surrounds a vertical portion of the top one of the semiconductor layers.

Another embodiment features an integrated circuit that includes a substrate having a planar surface and collector, base, and emitter semiconductor layers of a bipolar transistor. The collect, base and emitter semiconductor layers form a vertical sequence on the substrate in which intrinsic portions of two of the layers are sandwiched between the substrate and a remaining one of the layers. The base layer includes an extrinsic semiconductor extension that laterally encircles a vertical portion of the remaining one of the semiconductor layers.

BRIEF DESCRIPTION OF THE DRAWINGS

In the various Figures, like reference numbers indicate elements with similar functions.

DETAILED DESCRIPTION OF ILLUSTRATIVE EMBODIMENTS

Various embodiments provide n-type and p-type thin film bipolar transistors and integrated circuits (ICs) containing such bipolar transistors. The bipolar transistors have vertical semiconductor layer structures with more planar cross-sectional profiles than typical triple mesa structures.

Figure 2:
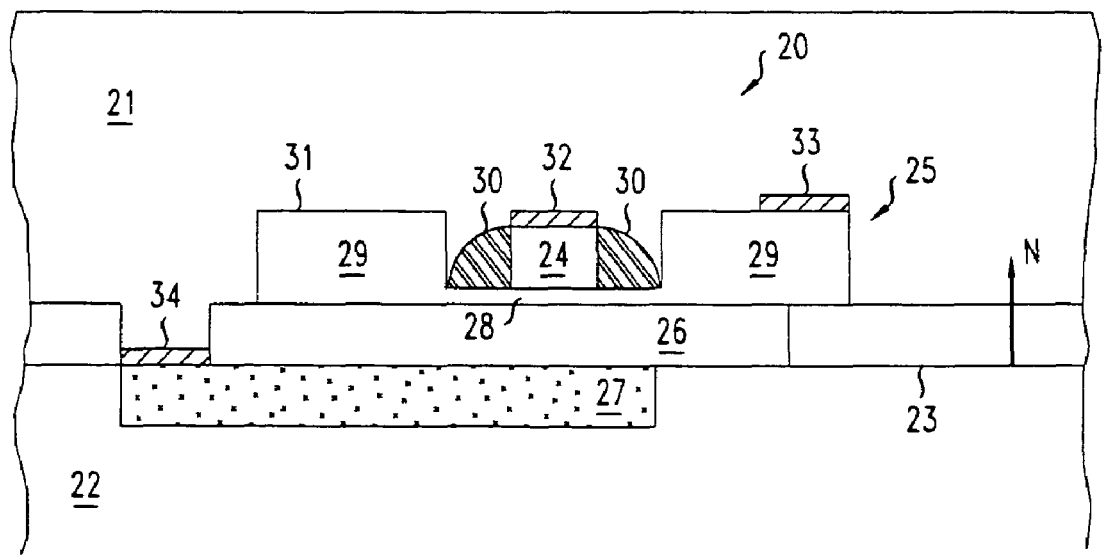
FIG. 2 is a cross-sectional view of a bipolar transistor whose semiconductor layers form a structure with a more planar profile than the triple mesa structure.

FIG. 2 shows one such thin film bipolar transistor 20. Bipolar transistor 20 includes a semiconductor layer sequence that forms a vertical stack along the direction of the normal vector, N, to adjacent surface 23 of semiconductor substrate 22. The semiconductor layer sequence includes the transistor's emitter, base, and collector layers 24, 25, 26 and a heavily doped subcollector layer 27. The base layer 25 includes both intrinsic and extrinsic portions 28, 29. The extrinsic portion 29 laterally surrounds the emitter layer 24.

The subcollector layer 27 is located in the semiconductor substrate 22 and forms a conductive electrical contact for the collector layer 26.

Herein, intrinsic and extrinsic refer to lateral regions of a bipolar transistor's active semiconductor layers. The intrinsic region includes the lateral portions of the active semiconductor layers that are vertically adjacent to the active p-n junctions of the bipolar transistor. The extrinsic region includes the lateral portions of the active semiconductor layers that are not vertically adjacent to such p-n junctions. The extrinsic region is laterally displaced from the transistor's p-n junctions along the surface of the substrate on which the transistor rests.

Bipolar transistor 20 includes a dielectric spacer 30 located between emitter layer 24 and extrinsic portion 29 of base layer 25. The extrinsic portion 29 has a top surface 31 that is vertically more distant from semiconductor substrate 22 than the active p-n junction between the base and emitter layers 25, 24. A substantial vertical portion of the emitter layer 24 is closer to the substrate's surface 23 than the top surface 31 of the extrinsic portion 29 of the base layer 25.

The bipolar transistor 20 also includes electrical contact layers 32, 33, 34 for emitter, base, and subcollector layers 24, 25, 27. Exemplary electrical contact layers 32-34 include heavily doped semiconductor and/or metal. The contact layer 34 for the subcollector layer 27 is buried in a contact via hole through the collector layer 26.

Figure 1:
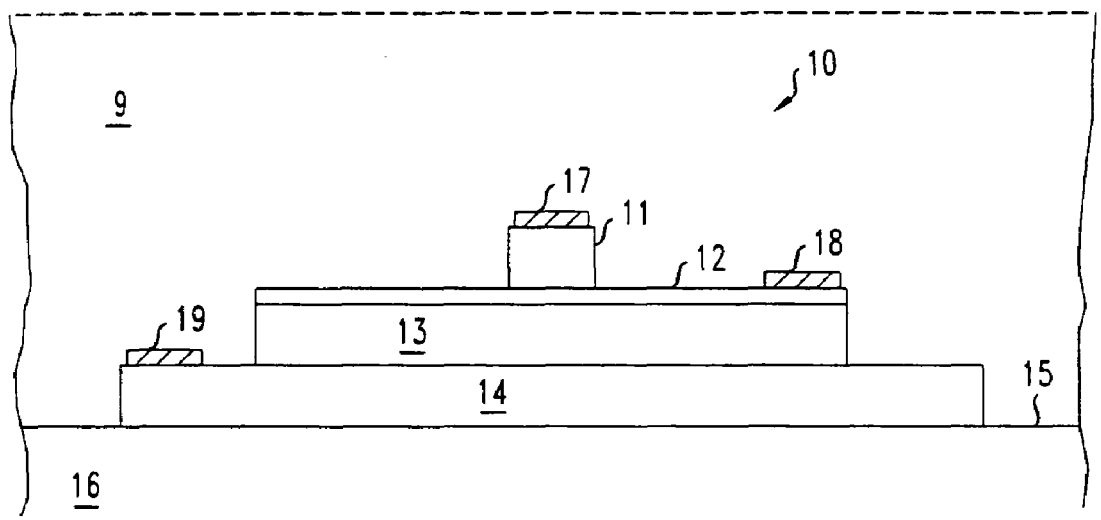
FIG. 1 is a cross-sectional view of a conventional bipolar transistor whose semiconductor layers form a triple mesa structure.

In the bipolar transistor 20, the vertical semiconductor layer structure forms a lower and less complex height profile than that of the bipolar transistor shown in FIG. 1. In the new vertical structure, extrinsic portion 29 of base layer 25 laterally surrounds emitter layer 24. Even though a thin dielectric spacer 30 separates the emitter layer 24 and extrinsic portion 29 of the base layer 15, the extrinsic portion 29 still provides an efficient thermal transport path for dissipating heat from the nearby emitter layer 24 to the substrate 22. This new thermal transport path can improve heat dissipation over that obtainable in triple mesa structure 10 of FIG. 1. The added extrinsic portion 29 or the base layer 25 also lowers the base sheet resistance in the extrinsic regions, causing a lowered parasitic base contact resistance. A low base resistance is often desirable to improve the speed of the device. Presence of the extrinsic portion 29 also causes the cross-sectional profile of the semiconductor layer stack to be more planar in the bipolar transistor 20 than in the bipolar transistor of FIG. 1. The more planar profile can improve adhesion of overlying protective dielectric layer 21. Finally, the more planar profile of bipolar transistor 20 can aid in reducing device feature sizes because of focusing depth limitations during lithographic mask production.

Figure 3:
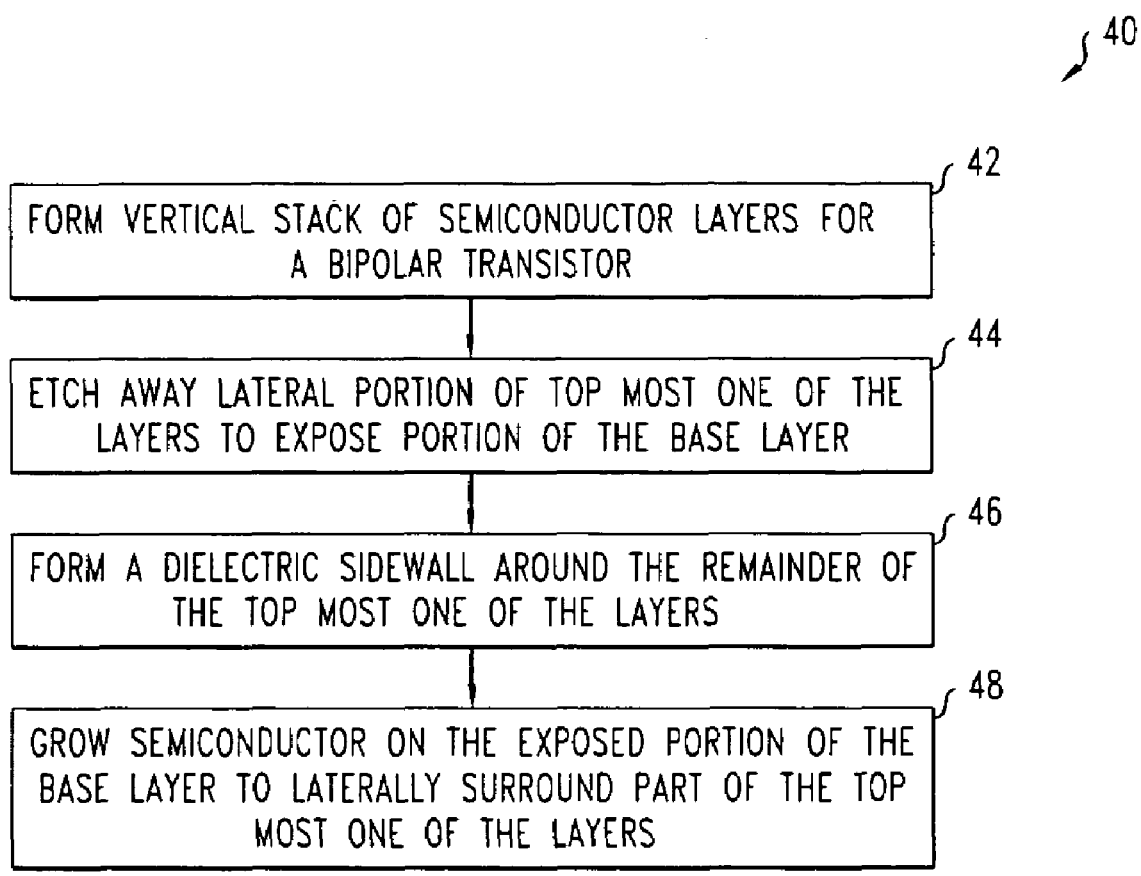
FIG. 3 is a flow chart for an embodiment of a method for fabricating a bipolar transistor with a vertical semiconductor layer structure.

FIG. 3 illustrates a method 40 for fabricating a bipolar transistor with a vertical semiconductor layer stack, e.g., bipolar transistor 20 of FIG. 2.

The method 40 includes forming a vertical stack of semiconductor layers for the bipolar transistor (step 42). The stack includes, at least, the active collector, base, and emitter semiconductor layers of the bipolar transistor. The stack may also include a heavily doped lowest semiconductor layer that functions as an electrical contact for lowest active semiconductor layer of the vertical stack. Exemplary forming steps use epitaxial semiconductor growth, dopant implantation and activation, and/or dopant diffusion and activation to form various ones of the semiconductor layers of the stack.

The method 40 includes etching away a lateral portion of the top most semiconductor layer of the stack to expose a lateral portion of the base layer, which is an intermediate layer (step 44). The location of the remaining portion of the top most semiconductor layer defines the intrinsic region of the final bipolar transistor. The exposed portion of the base layer is located in the extrinsic region of the final bipolar transistor, i.e., lateral to the active p-n transistor junctions. In various embodiments, the top most semiconductor layer is either the emitter layer or the collector layer.

The method 40 includes forming a dielectric sidewall or spacer around the portion of the top most semiconductor layer that remains after the etch step (step 46). The dielectric sidewall or spacer will provide electrical isolation between the top semiconductor layer and a later formed extrinsic portion of the base layer. The dielectric sidewall or spacer can also stop semiconductor growth on the top most semiconductor layer during the later formation of said extrinsic portion.

The method 40 also includes selectively growing semiconductor on the previously exposed extrinsic portion of the base layer such that the growing semiconductor laterally surrounds part or all of the top most semiconductor layer (step 48). The growing semiconductor has the same conductivity type, i.e., n-type or p-type, as the original base layer. Thus, the newly grown semiconductor produces an extrinsic extension of the base layer. The growth step produces a vertical semiconductor layer structure in which semiconductor of the extrinsic base laterally surrounds a vertical portion of the top most semiconductor layer.

Step 48 produces a semiconductor layer stack in which much semiconductor of the extrinsic base is located near the top most active semiconductor layer of the bipolar transistor. Laterally surrounding a vertical portion of the top most active semiconductor layer with a portion of the extrinsic base produces a layer structure with a more planar cross-sectional profile. Laterally surrounding a vertical portion of the top most semiconductor layer with a portion of the extrinsic base also can improve the efficiency of heat dissipation during transistor operation. The efficiency can improve, because the extrinsic portion of the base layer now provides a more efficient transport path for heat generated in the top most semiconductor layer than the thick adjacent dielectric of the triple mesa structure. In the new transport path, dielectric sidewall or spacer around the top most semiconductor layer is thin enough to not substantially impede heat dissipation to the nearby extrinsic base.

EXAMPLE 1

Figure 4:
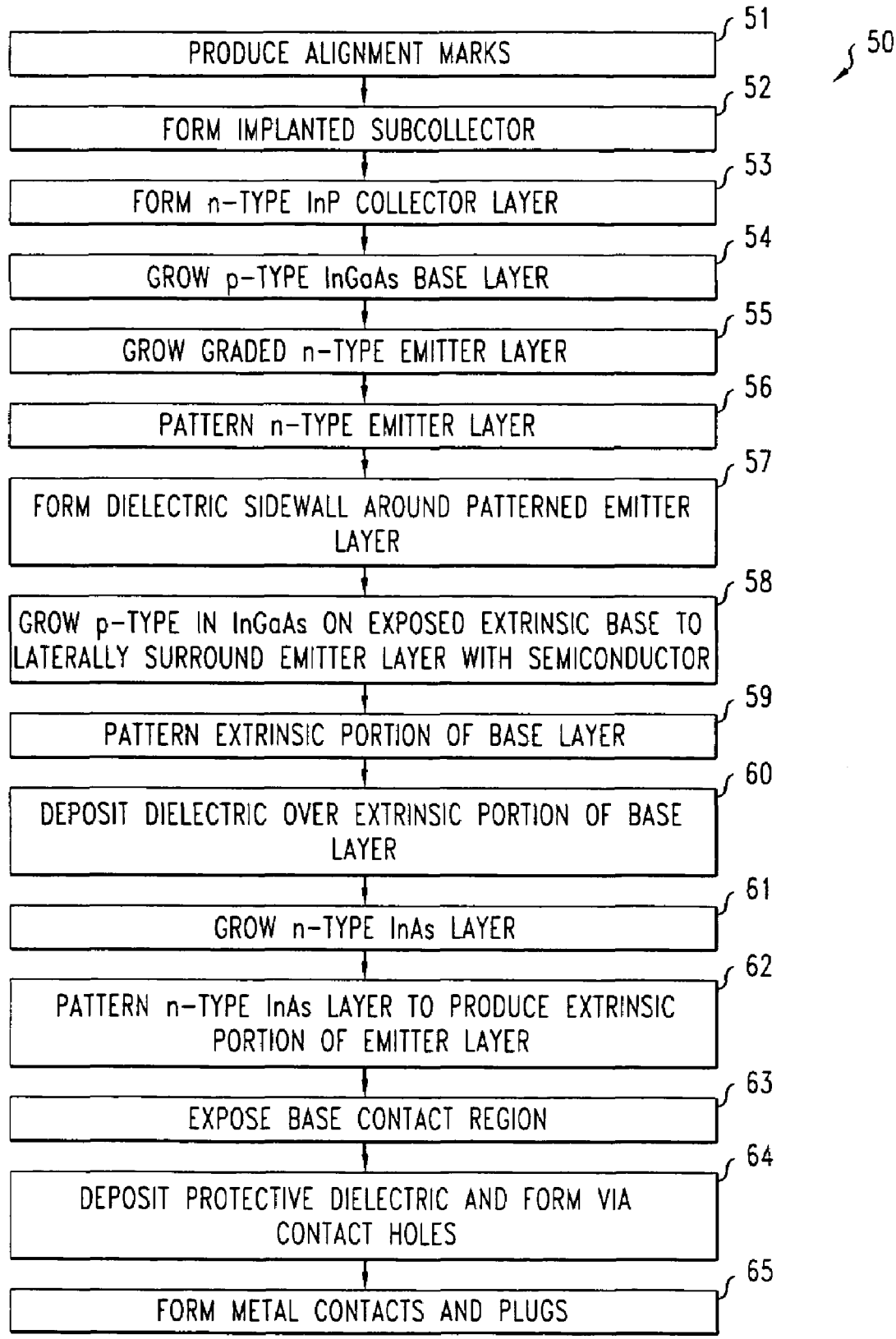
FIG. 4 is a flow chart for a specific embodiment of the fabrication method of FIG. 3.

FIG. 4 illustrates a specific method 50 for fabricating a NPN double heterojunction bipolar transistor according to method 40 of FIG. 3. The method 50 produces intermediate structures 70-80 of FIGS. 5-9 and 11-16 and final structure 82 of FIG. 17.

Figure 5:
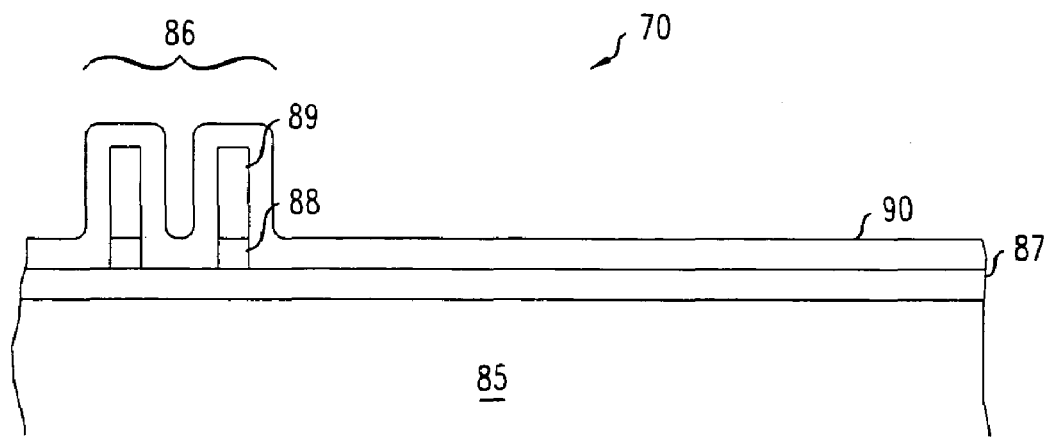
FIG. 5 is a cross-sectional view of an intermediate structure with alignment marks formed according to the method of FIG. 4.
Figure 6:
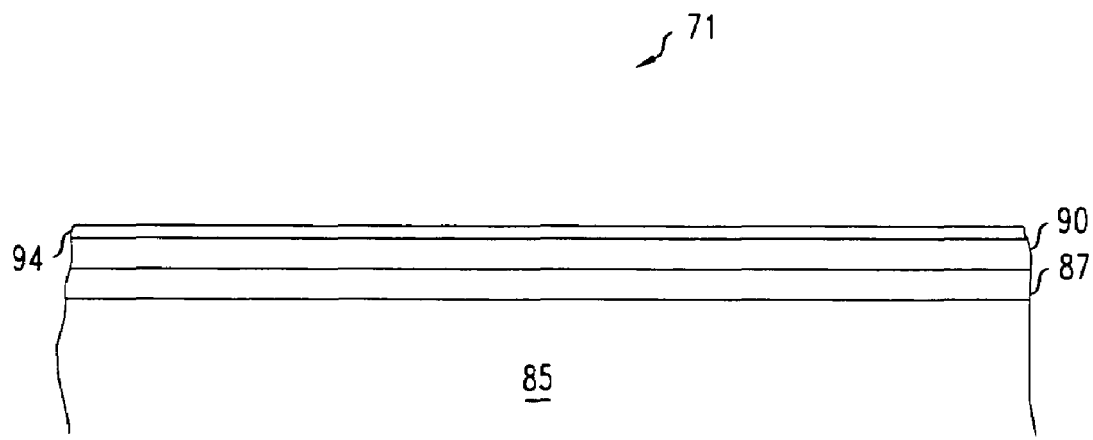
FIGS. 6-8 are cross-sectional views of structures produced during the formation of an implanted subcollector according to the method of FIG. 4.

The fabrication method 50 includes producing a set alignment marks 86 on a planar InP substrate 85 as shown in structure 70 of FIG. 5 (step 51). The alignment marks 86 enable optical mask alignments during subsequent steps.

Producing alignment marks 86 involves growth and patterning steps. The growth step includes epitaxially growing layer 87 of about 500 angstroms (Å) of indium gallium arsenide (InGaAs), layer 88 of about 500 Å of InP, and layer 89 of about 3,000 Å of indium gallium arsenide (InGaAs) on the InP substrate 85. The patterning step includes performing a mask controlled wet or dry etch to remove portions of the InGaAs and InP layers 89, 88 located lateral to the desired alignment marks 86. For the patterning step, an exemplary wet etchant is an aqueous solution having equal volume parts of HCl, $H_3PO_4$, and $H_2O$ for InP and an aqueous solution of one part $H_3PO_4$, one part $H_2O_2$, and between 1 and 100 parts of $H_2O$ for InGaAs. For this wet etchant, the InP layer 88 functions as an etch stop. The remaining InGaAs layer 87 functions as a protective layer during subsequent ion-implantations and thermal implant activations.

After forming the set of alignment marks 86, a plasma enhanced chemical vapor deposition (PECVD) deposits a silicon nitride layer 90, e.g., a $Si_3N_4$ layer, over both the set of alignment marks 86 and the remainder of InP substrate 85. The silicon nitride layer 90 protects the alignment marks 86 during subsequent ion-implantations and thermal implant activation. Exemplary conditions for the PECVD include a total gas flow of 1000-2000 standard cubic centimeters per minute (sccm), a gas mixture of 0.2-2% $SiH_4$ diluted in He with 30-50% $N_2O$, and a plasma power of 5 watts (W)-50 W at a 250° C. substrate temperature and a chamber pressure of 400-1500 mTorr.

Figure 8:
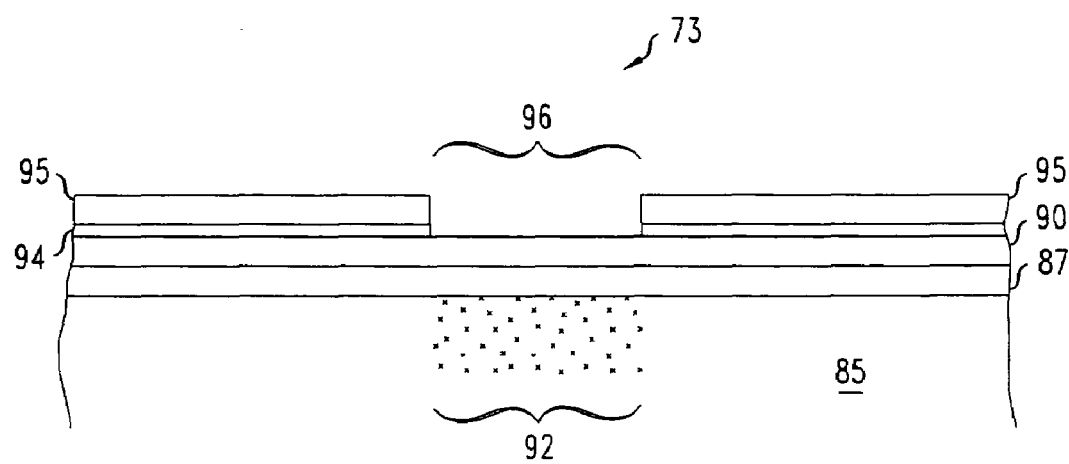
Figure 9:
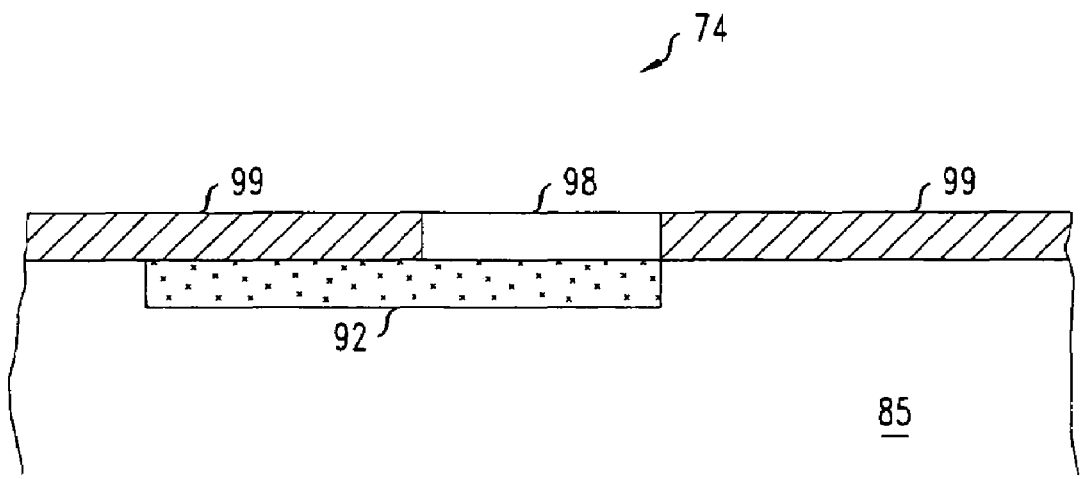
FIG. 9 is a cross-sectional view of an intermediate structure with a collector layer formed according to the method of FIG. 4.

The fabrication method 50 includes forming an implanted subcollector 92 in InP substrate 85 as shown in FIG. 8 (step 52). The subcollector 92 is heavily n-type doped and has an exemplary thickness of about 6000 Å. Exemplary implantation dopants include sulfur (S), germanium (Ge), and/or phosphorus (P). An exemplary implantation step implants S ions with energies between 30 kilo-electron volts (keV) and 500 keV and an implant dose between $5 \times 10^{13}$ and $10^{16}$ dopant atoms per centimeter$^{-2}$ ($cm^{-2}$). Forming the subcollector 92 in the InP substrate 85 makes the cross-sectional profile of the final bipolar transistor more planar as compared to that of the bipolar transistor of FIG. 1.

Figure 7:
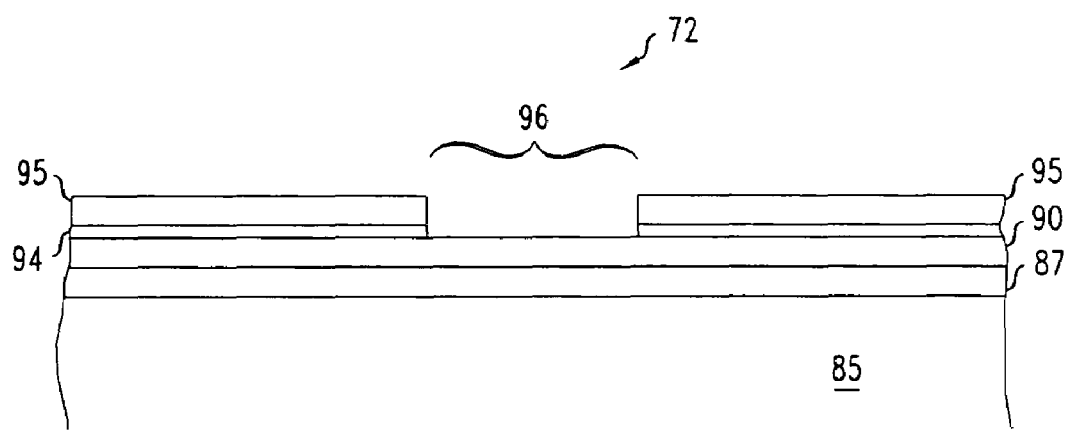

Forming the subcollector 92 includes making an implant mask, doping the InP substrate 85 through the implant mask, and stripping the implant mask and layers 90, 87. Making the implant mask includes performing an evaporation deposition of about 100 nanometers (nm) of titanium (Ti), i.e., a seed layer 94, on the InP substrate 85 to produce structure 71 of FIG. 6. Then, a photoresist mask (not shown) is formed on the Ti seed layer 94 via I-line stepper lithography. Then, an electroplate step deposits a gold (Au) layer on the portion of the Ti seed layer 94 exposed by a window in the photoresist mask. Then, the photoresist is stripped in a wet chemical process using acetone, NMP (n-methyl-pyrrolidone), or a commercial strip product such as Shipley PRS-1000 to produce an Au implantation mask 95 with a window 96 as shown in FIG. 7. Doping the InP substrate 85 includes performing the above-discussed method to implant through window 96 S, Ge, and/or P dopant ions and then, performing a rapid thermal anneal (RTA) at about 700° C.-900° C. for about 5-60 seconds to activate the dopants and produce structure 73 of FIG. 8. Alternatively, the activation may be carried out in an MOCVD (Metalorganic Chemical Vapor Deposition) reactor under a phosphine overpressure (e.g., 10-500 mTorr) at a temperature between 500° C. and 900° C. for 5-30 minutes. Stripping the Au implant mask 95 includes performing a series of wet etches to sequentially remove the Au and Ti, the silicon nitride layer 90, and the InGaAs layer 87. Exemplary wet etchants include potassium iodine (KI) for Au, hydrofluoric acid (HF) for Ti and silicon nitride, and one part of $H_3PO_4$ mixed with one to 10 parts of $H_2O_2$ and 10-300 parts of $H_2O$ for InGaAs.

The fabrication method 50 includes forming an n-type collector layer on InP substrate 85 (step 53). The collector layer includes both an active n-type collector 98 and a non-conductive lateral barrier 99 in a single layer. The lateral barrier 99 electrically isolates the active n-type collector 98 from other devices (not shown) laterally located on the same InP substrate 85. The incorporation of the active n-type collector 98 and non-conductive lateral barrier 99 into a single layer makes a more planar bipolar transistor, e.g., than triple mesa structure 10 of FIG. 1.

Forming the collector layer includes growing an InP layer and then, making a non-conductive lateral barrier in the grown InP layer.

Growing the InP layer involves performing a metal organic molecular beam epitaxy (MOMBE) growth of n-type InP on the InP substrate 85. The MOMBE growth produces a layer of about 1,000 Å-2,500 Å of InP with an n-type dopant density of $2 \times 10^{16}$-$8 \times 10^{17}$ tin (Sn) atoms per $cm^3$ and preferably about $1 \times 10^{17}$ Sn atoms per $cm^3$. The conditions for the MOMBE include: a substrate temperature of about 400° C.-500° C., a Sn effusion cell temperature of 600° C.-900° C., a TMIn (tri-methyl-indium) flow rate of 1 sccm to 10 sccm, a phosphine ($PH_3$) flow rate of 1 sccm to 10 sccm, and a chamber background pressure of $10^{-9}$ to $10^{-6}$ Torr.

Making the non-conductive lateral barrier 99 is a multi-step process that includes forming a $SiO_2$ mask, coating the InP layer with a diffusant layer, diffusing the diffusant into the InP layer, and removing the $SiO_2$ mask and remaining diffusant. The step for forming a $SiO_2$ mask involves performing a PECVD of a 2000 Å thick $SiO_2$ layer on the InP layer, forming a photoresist mask on the $SiO_2$, etching away unprotected portions of the $SiO_2$ layer, and performing a reactive ion etch (RIE) to strip the photoresist mask. The formed $SiO_2$ mask covers the portion of the InP layer selected for the active n-type collector 98. The step for coating the InP layer involves spin coating a liquid zinc/phosphorous (Zn/P) silicate, e.g., the ZPDC2-2000 product sold Futurrex Inc. of 12 Cork Hill Road, Franklin, N.J. 07416, onto the masked InP layer. The step for diffusing the diffusant involves performing a RTA at about 250° C.-750° C. for about 10-360 seconds. The RTA causes Zn and P atoms from the diffusant layer to diffuse into portions of the InP layer that are unprotected by the $SiO_2$ mask. Said portions form an annular non-conductive barrier 99 around the active n-type InP collector 98. The step for removing the mask and remaining diffusant includes washing the structure with an aqueous solution of hydrogen fluoride (HF). The HF solution removes both the $SiO_2$ mask and the remaining Zn/P silicate to produce structure 74 of FIG. 9. Exemplary HF solutions include water and HF in relative molar ratios of about 1:17 to 1:100. Alternatively, a buffered oxide etch consisting of one part HF in 7 to 100 parts of ammonium fluoride ($NH_4F$) may be used to remove the $SiO_2$ mask and the remaining diffusant material.

The formation of the InP collector layer is followed by growth of a quaternary InGaAsP semiconductor layer. The quaternary layer functions to reduce the step height in the conduction band misalignment between the InP collector layer and the subsequently grown InGaAs base layer thereby minimizing the parasitic collector resistance. The MOMBE conditions for the growth of the InGaAsP layer include: a substrate temperature of 400° C.-500° C., a Sn effusion cell temperature of 600° C.-900° C., a TMIn (tri-methyl-indium) flow rate of between 1 sccm and 10 sccm, a TEGa (tri-ethyl-gallium) flow rate of between 1 sccm and 10 sccm, a $PH_3$ flow rate of between 1 sccm and 10 sccm, an arsine ($AsH_3$) flow rate of between 1 sccm and 10 sccm, and a chamber background pressure between $10^{-9}$ and $10^{-6}$ Torr. The InGaAsP layer is doped with Sn at a concentration of $2 \times 10^{16}$ to $10^{18}$ Sn atoms per $cm^3$, and preferably at a concentration of about $10^{17}$ $cm^{-3}$. The InGaAsP layer has a thickness of 200 Å to 800 Å.

The growth of the quaternary layer is followed by growth of an n-doped InGaAs layer, which acts as a set back that increases the quality of the p-n-interface between the collector 98 and the subsequently grown base layer. The In mole fraction of this InGaAs layer is between 40% and 60% and is preferably about 53%. For this layer, the MOMBE growth conditions include a substrate temperature of 400° C.-500° C., a Sn effusion cell temperature of 600° C.-900° C., a TMIn flow rate of between 1 sccm and 10 sccm, an arsine flow rate of between 1 sccm and 10 sccm, a TEGa flow rate of between 1 sccm and 10 sccm, and a chamber background pressure between $10^{-9}$ and $10^{-6}$ Torr. This InGaAs layer is n-type doped with Sn to a concentration of $2 \times 10^{16}$ to $10^{18}$ Sn atoms per $cm^3$ and preferably to a concentration of about $10^{17}$ $cm^{-3}$. This InGaAs has a thickness between 200 Å and 800 Å.

The fabrication method 50 includes growing a p-type InGaAs base layer 100 on the structure 74 (step 54). A MOMBE epitaxially grows the p-type InGaAs base layer 100 to a thickness of 250 Å-1,000 Å and preferably to a thickness of about 300 Å. The In mole fraction of the InGaAs is between 40% and 60% and preferably is about 53%. The MOMBE conditions for growth of this layer include a substrate temperature of 400° C.-500° C., a TMIn flow rate of between 1 sccm and 10 sccm, an arsine flow rate of between 1 sccm and 10 sccm, a TEGa flow rate of between 1 sccm and 10 sccm, and a chamber background pressure of between $10^{-9}$ and $10^{-6}$ Torr. The InGaAs base layer is p-type doped with carbon (C) or beryllium (Be) to a dopant concentration of $2 \times 10^{18}$ to $6 \times 10^{19}$ dopant atoms per $cm^3$ and preferably to a dopant concentration of about $3 \times 10^{19}$ $cm^{-3}$. The source of the dopant atoms is $CBr_4$ in the case of C and a Be effusion cell in the case of Be. To dope with C, $CBr_4$ is flowed at a rate of between 1 sccm and 10 sccm. To dope with Be, the Be effusion cell is maintained at a temperature between 400° C. and 900° C. In the base layer 100, the band gap may also be graded to enhance electron transport through the base. The difference in band gap between the emitter and the collector junction is typically between 0 and 2 kT where T is a standard operating temperature.

Figure 11:
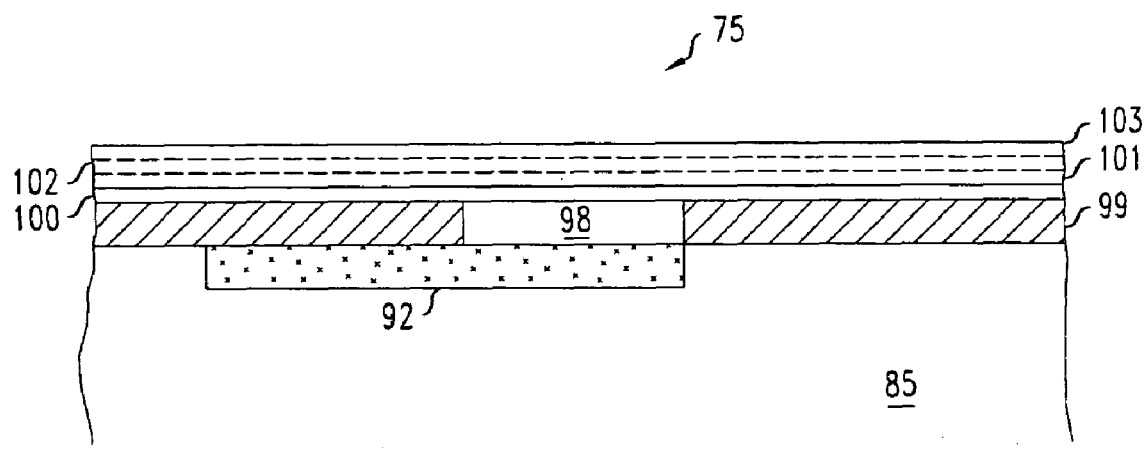
FIG. 11 is a cross-sectional view of an intermediate structure with emitter and base layers formed according to the method of FIG. 4.

The fabrication method 50 includes growing a graded n-type emitter layer by a three-step process to produce structure 75 of FIG. 11 (step 55). The first step is an MOMBE growth of a thin InGaAsP sublayer 101 that reduces carrier recombination at the interface with base layer 100. The InGaAsP sublayer 101 is 50 Å-80 Å thick and preferably is about 80 Å thick. The InGaAsP sublayer 101 may have only unintentional dopants, e.g., at a concentration of about $10^{16}$-$10^{17}$ dopant atoms per $cm^3$, or it may be intentionally n-type doped with Sn to a concentration of $10^{17}$-$10^{19}$ Sn atoms per $cm^3$. The second step is an MOMBE growth of an n-type InP sublayer 102. The InP sublayer 102 is 500 Å-1,500 Å thick and preferably is about 1,000 Å thick. The n-type InP sublayer 102 has about $10^{17}$-$10^{19}$ Sn dopant atoms per $cm^3$. The third step is an MOMBE growth of an n-type InGaAs sublayer 103. The InGaAs sublayer 103 is 500 Å-1,500 Å thick and preferably is about 1,000 Å thick. The InGaAs sublayer 103 has about $10^{18}$-$10^{20}$ Sn dopant atoms per $cm^3$. The InGaAs sublayer 103 is configured to lower contact resistances with a subsequently formed extrinsic InGaAs or InAs emitter (not shown).

The In mole functions for the InGaAs layers 101-103 of the emitter layer are in a molar range of about 40% to 100% and preferably are about 53%. The MOMBE conditions for growing these layers 101-103 include: a substrate temperature of 400° C.-500° C., a Sn effusion cell temperature of 600° C.-900° C., a TMIn flow rate of between 1 sccm and 10 sccm, an arsine flow rate of between 1 sccm and 10 sccm, a TEGa flow rate of between 1 sccm and 10 sccm, and a chamber background pressure between $10^{-9}$ and $10^{-6}$ Torr.

Figure 12:
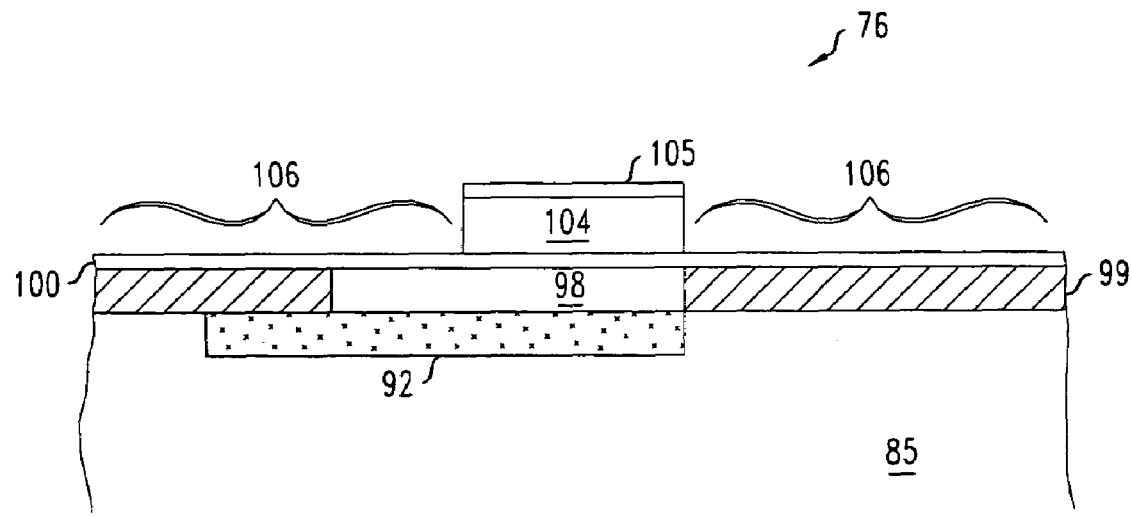
FIG. 12 is a cross-sectional view of an intermediate structure with a patterned emitter layer formed according to the method of FIG. 4.

The fabrication method 50 includes patterning the n-type emitter layer 101-103 of structure 75 to produce emitter 104 of structure 76 as shown in FIG. 12 (step 56). The patterning includes forming a $SiO_2$ mask and etching the emitter layer 101-103 under control of the $SiO_2$ mask.

The substep of forming a $SiO_2$ mask includes performing a PECVD of a conformal layer of about 1,000 Å of $SiO_2$ on emitter layer 101-103, making a photoresist mask on the $SiO_2$ layer, and dry etching the $SiO_2$ layer to produce the $SiO_2$ mask. The conditions for the PECVD are: a total gas flow of 1000 sccm-2000 sccm, a gas mixture of 0.2%-2% $SiH_4$ diluted in He with 30%-50% $N_2O$, a plasma power of 5 W-50 W, a 250° C. substrate temperature, and a chamber pressure of 400-1500 mTorr. On the $SiO_2$ layer, the photoresist mask is made via 0.25 micron I-line lithography. The dry etch that produces the $SiO_2$ mask is an ICP RIE (inductively coupled plasma reactive ion etch). The conditions for the ICP RIE are: a total gas flow of 20 sccm-80 sccm of a mixture of $CHF_3$, $O_2$, and Ar, i.e., 2%-10% $O_2$ and 10%-50% Ar, a pressure of 2-12 mTorr, a substrate temperature of about 23° C., an ICP power of 200 W-500 W, and a RIE power of 20 W-80 W. Plasma and/or wet chemical etches strip off the photoresist mask.

The substep of etching the emitter layer involves performing a dry or wet etch of the portions of emitter layer 101-103 that are unprotected by the $SiO_2$ mask 105. The etch leaves a patterned emitter 104 and exposes a portion 106 of base layer 100. The patterned emitter 104 and the portion 106 of base layer 100 are in the respective intrinsic and extrinsic regions of the bipolar transistor. An exemplary method for etching the emitter layer 104 involves a combination of a dry etch and a wet etch. The dry etch is performed for 1 to 3 minutes in a high plasma density RIE system such as an Inductively Coupled Plasma (ICP) or Electro cyclotron (ECR) reactor. The dry etch conditions include: a Cl/Ar or a $BCl_3$/Ar atmosphere at a pressure between 1 mTorr and 10 mTorr with flow rates between 10 sccm and 50 sccm for each gas, a plasma source power between 200 W and 800 W, and a RIE platen power between 20 W and 150 W to produce a self-bias between 10 and 100V. Alternatively, $N_2$ can be added to the gas mixture with a flow rate of between 10 sccm and 100 sccm. The dry etch is followed by a 10 to 60 second wash in a bromine (Br) : $H_2O$ solution that includes one part Br in 1 to 1000 parts of water. The wash removes dry etch residues. The dry etch and wash are followed by an InP wet etch for about 10 to 60 seconds in an aqueous 1:1:1 solution of $HCl:H_3PO_4:H_2O$.

Figure 13:
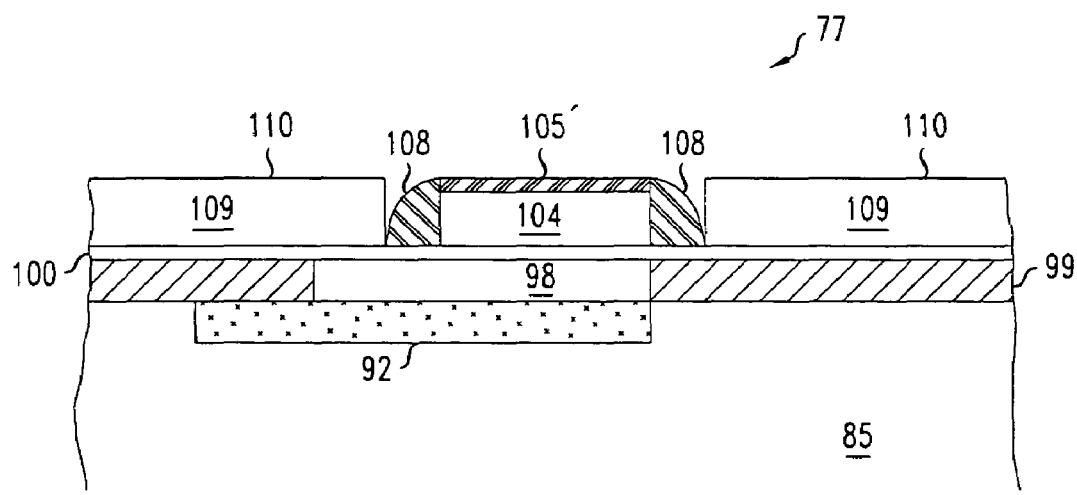
FIG. 13 is a cross-sectional view of an intermediate structure with an extrinsic base layer grown according to the method of FIG. 4.

The fabrication method 50 includes forming a dielectric sidewall 108 around patterned emitter 104 of structure 76 (step 57). Forming the sidewall 108 includes performing a PECVD of a conformal silicon nitride layer and then, RIE etching back the silicon nitride to produce the sidewall 108 as shown in FIG. 13. The conditions for the PECVD include: a total gas flow rate of 1000 sccm-2000 sccm of a mixture of 0.1-2% $SiH_4$ and 0.1-5% $NH_3$ diluted in a carrier gas composed of 30-90% He and 70-10% $N_2$, a pressure of 100-700 mTorr, a plasma power of 10 W-130 W, and a substrate temperature of 120° C.-300° C. The conditions for the RIE etch back include: a mixture of Ar/$CF_4$/$O_2$ with a fraction of 50-98% $CF_4$, 2-50% $O_2$, and 0-20% Ar at a pressure of 3-20 mTorr in an inductively coupled plasma (ICP) reactor, with a total gas flow of 20 sccm-50 sccm, an ICP power of 100 W-400 W, and an RIE power of 5 W-90 W. The RIE etch stops on extrinsic portion 106 of base layer 100. The RIE etch back produces a sidewall 108 with a thickness of 500 Å-1,500 Å and preferably a thickness of about 1,000 Å. The sidewall 108 laterally surrounds the patterned emitter 104. The emitter's top surface retains a $SiO_2$ layer 105' as shown in FIG. 13.

The fabrication method 50 includes performing an MOMBE growth of p-type InGaAs semiconductor on the exposed extrinsic portion 106 of base layer 100 to produce structure 77 of FIG. 13 (step 58). The newly grown base semiconductor 109 laterally surrounds patterned emitter 104. The MOMBE conditions cause selective growth of InGaAs on the exposed portion of the base layer 100 without causing growth of InGaAs on silicon nitride sidewall 108 or on $SiO_2$ layer 105'. The In mole fraction of the grown InGaAs is between 40% and 60% and is preferably about 53%. The conditions for the MOMBE growth of this layer include: a substrate temperature of 200° C.-500° C., a TMIn flow rate of between 1 sccm and 10 sccm, an arsine flow rate of between 1 sccm and 10 sccm, a TEGa flow rate of between 1 sccm and 10 sccm, and a chamber background pressure of $10^{-9}$ to $10^{-6}$ Torr. During the MOMBE growth, the InGaAs layer is p-type doped with carbon (C) or beryllium (Be) to a concentration of $2 \times 10^{18}$-$6 \times 10^{19}$ dopant atoms per $cm^3$ and preferably to a concentration of about $3 \times 10^{19}$ dopant atoms per $cm^3$. The source of the dopant is $CBr_4$ in the case of C and is a Be effusion cell in the case of Be. During the MOMBE the flow rate of $CBr_4$ is between 1 sccm and 10 sccm in the case of C doping, and the Be effusion cell temperature is between 400° C. and 900° C. in the case of Be doping. The MOMBE produces a polycrystalline InGaAs layer 109 that is 800 Å-2,000 Å thick and preferably is about 1,500 Å thick.

The newly grown extrinsic portion 109 of the base layer laterally surrounds a vertical portion of the patterned emitter 104. The extrinsic portion 109 of the base extends above the base-emitter junction, and preferably has a top surface 110 as high as or higher than the top surface of the patterned emitter 104. The extrinsic portion 109 provides a thermally conductive semiconductor pathway for dissipating heat from the patterned emitter 104 during transistor operation. Since silicon nitride sidewall 108 is thin, the sidewall 108 does not substantially impede heat transfer from the patterned emitter 104 to the adjacent extrinsic portion 109 of the transistor's base.

The fabrication method 50 includes performing a patterning step that laterally limits extrinsic portion 106, 109 of the transistor's base (step 59). The patterning involves forming a photoresist mask over structure 77 by I-line lithography, dry or wet etching away an annular unprotected portion of the extrinsic base material 109, 106, and then, wet stripping the photoresist mask with NMP or the Shipley PRS-1000 remover. Exemplary dry etch conditions include: a gas mixture of equal parts of Cl and Ar in an ICP reactor, a 400 W-600 W ICP power, a 20 W-80 W RIE power, a chamber pressure of 3-20 mTorr, a substrate temperature of 10° C.-30° C., and a total gas flow rate of 20 sccm-40 sccm. The patterning step laterally isolates the extrinsic portion of the base 109, 100 from adjacent lateral regions on the InP substrate 85 as seen in FIG. 14.

Figure 14:
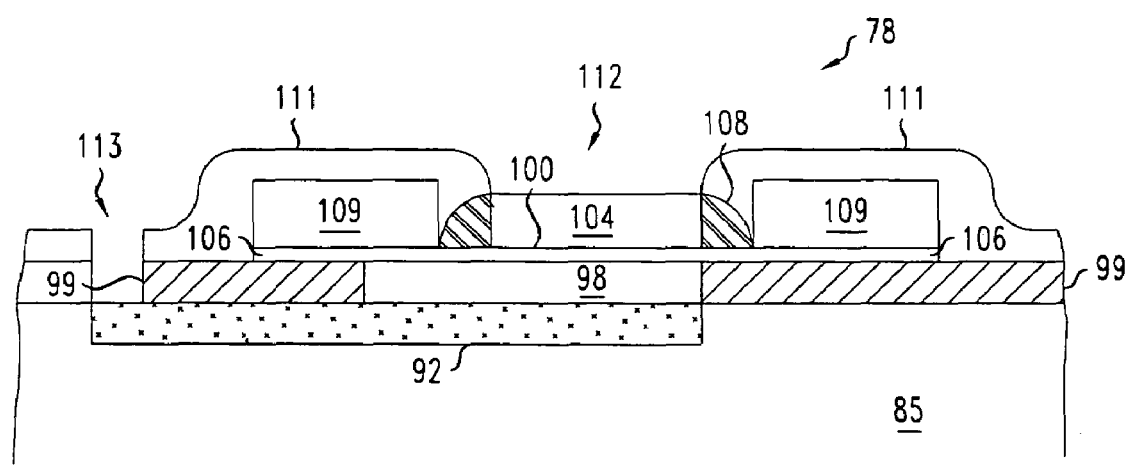
FIG. 14 is a cross-sectional view of an intermediate structure with a dielectric isolation layer formed according to the method of FIG. 4.

The fabrication method 50 includes depositing a dielectric layer 111 over extrinsic portion 109 of the base and patterning the dielectric layer 111 as shown in FIG. 14 (step 60). The depositing substep involves performing either a PECVD of $SiO_2$ on structure 77 or spin coating and baking a liquid precursor on the structure 77 to produce a conformal dielectric layer. Exemplary conditions for the PECVD of $SiO_2$ are described in above step 56. Exemplary spin coating liquids include benzocyclobutane (BCB) and precursors of silicate glasses such as ACCUGLASS T-03AS, which is sold by Honeywell Inc., Sunnyvale, Calif. An exemplary spin coating produces a 200 nm-500 nm thick silicate film by spinning the spin-on coating at 2000-5000 RPM and then, curing the coating at 200° C.-350° C. The patterning substep includes making a photoresist mask by I-line stepper lithography, dry or wet etching the already deposited dielectric layer to form via holes 112, 113, and RIE stripping the photoresist. The via holes 112, 113 expose portions of patterned intrinsic emitter 104 and non-conductive lateral barrier 99. For an exemplary $SiO_2$ or silicate glass dielectric layer 111, an exemplary wet etchant is the above-described aqueous HF solution. The patterning substep also includes performing a mask-controlled dry etch of lateral barrier 99 to deepen the via hole 113 so that a contact area is exposed on subcollector 92. An exemplary dry etch of $SiO_2$ uses a $CHF_3$ and oxygen mixture with 2%-50% oxygen, a pressure of 2-100 mTorr, and a total gas flow of 20 sccm-100 sccm at room temperature.

Figure 15:
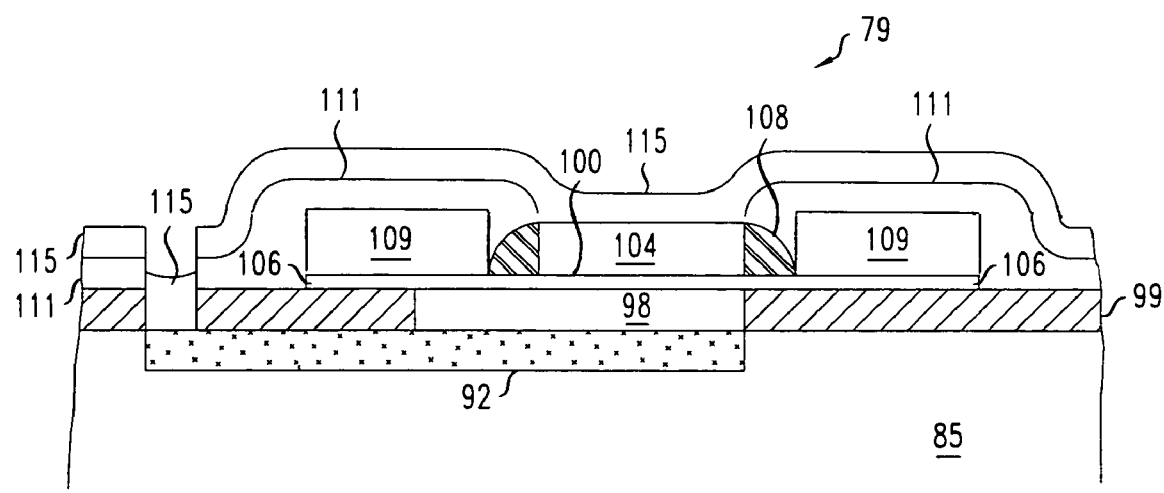
FIG. 15 is a cross-sectional view of an intermediate structure with an extrinsic emitter layer formed according to the method of FIG. 4.

The fabrication method 50 includes growing an n-type InAs layer 115 on structure 78 to produce structure 79 of FIG. 15 (step 61). The growth involves performing a molecular beam epitaxy (MBE) at a substrate temperature below 350° C., a chamber pressure of less than $10^{-9}$ Torr, an In effusion cell temperature of 600° C.-850° C., and an As effusion cell temperature of 300° C.-500° C. The low substrate temperature causes polycrystalline InAs to grow on both dielectric and semiconductor in a non-selective manner. The MBE produces an n-type InAs layer 115 with a thickness of 1000 Å to 5000 Å and a density of about $10^{19}$-$3\times10^{20}$ Sn n-type dopant atoms per $cm^3$.

Figure 16:
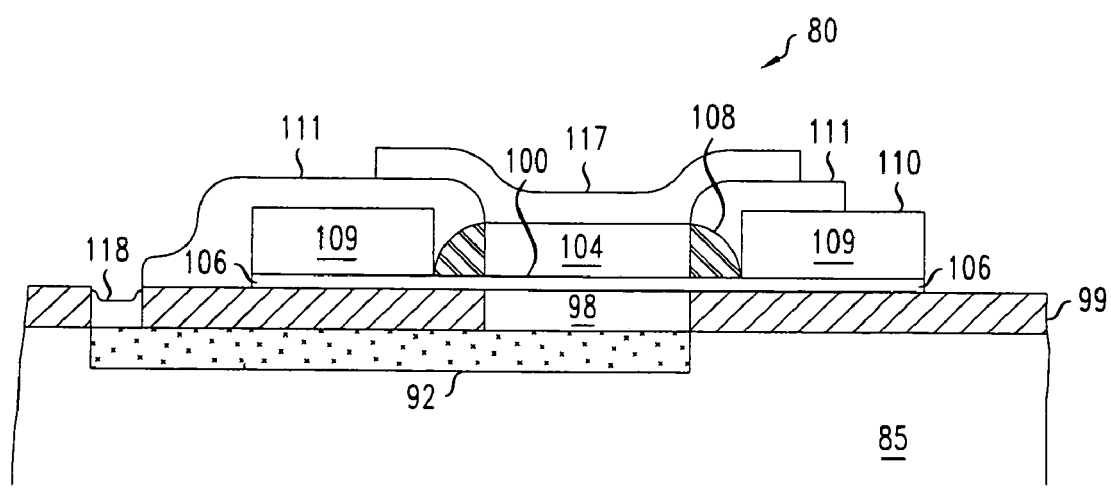
FIG. 16 is a cross-sectional view of an intermediate structure having an extrinsic emitter layer and a semiconductor subcollector contact formed according to the method of FIG. 4.

The fabrication method 50 includes patterning the n-type InAs layer 115 of structure 79 to produce extrinsic emitter 117 and semiconductor subcollector contact 118 as shown in structure 80 of FIG. 16 (step 62). The patterning involves performing a mask-controlled dry or wet etch of the polycrystalline InAs layer. An exemplary etch includes an aqueous solution having 1 part $H_2O_2$ and 1 part $H_3PO_4$ diluted in 20-100 parts of water. The final extrinsic emitter 117 extends over a portion of extrinsic portion 109 of the base thereby providing improved thermal coupling between emitter 104 and extrinsic portions 109, 106 of the base.

The fabrication method 50 includes performing a mask-controlled etch of dielectric layer 111 to expose a contact region on top surface 110 of the extrinsic portion 109 of the base (step 63). For an exemplary $SiO_2$ dielectric layer 111, a suitable wet etchant is the above-described aqueous HF solution. The etch of the dielectric layer 111 produces structure 80 of FIG. 16.

Figure 17:
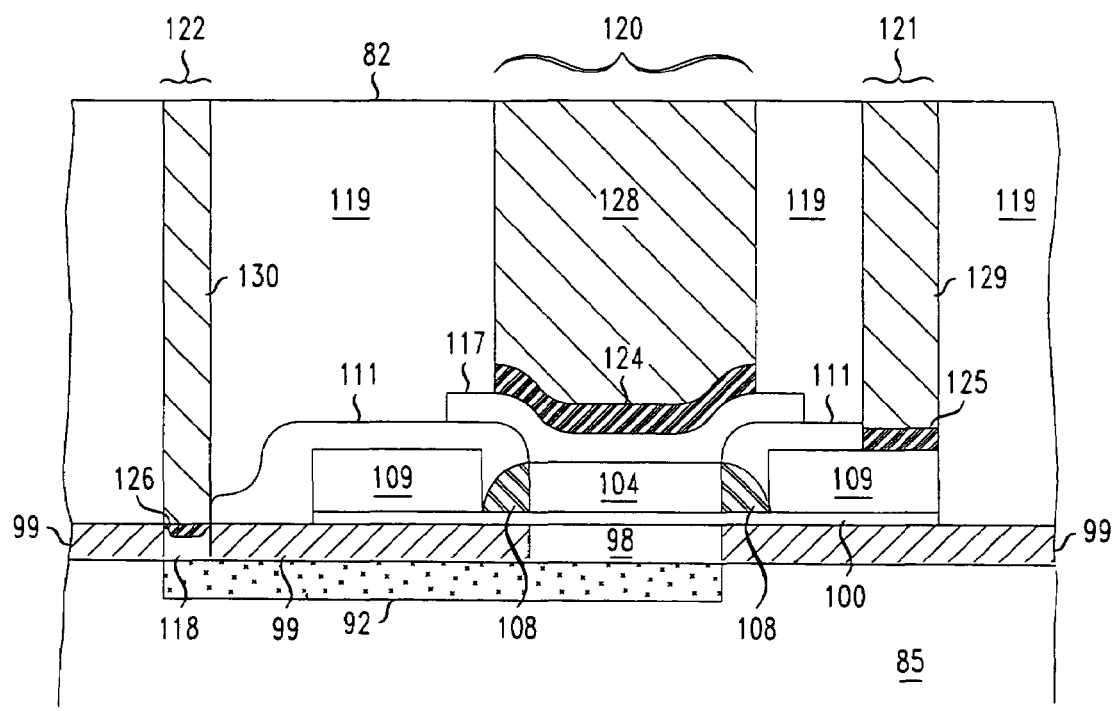
FIG. 17 is a cross-sectional view of a portion of an integrated circuit (IC) having a bipolar transistor formed according to the method of FIG. 4.

The fabrication method 50 includes depositing a planarizing protective dielectric layer 119 and forming via contact holes 120-122 for extrinsic emitter 117, extrinsic base 109, and subcollector 92 as shown in FIG. 17 (step 64). Depositing the protective dielectric layer 119 includes spin coating either BCB or a liquid precursor of silicate glass over structure 80, baking the coating to cause curing, and planarizing the resulting dielectric layer. Forming the via contact holes 120-122 involves dry etching the protective dielectric layer 119 under the control of a conventional etch mask. An exemplary dry etch uses an etch gas mixture of $CF_4$, $O_4$, Ar having 2%-20% $O_2$ and 10%-30% Ar, a total gas flow of 20 sccm-100 sccm, a pressure of 2-200 mTorr, a substrate temperature of about 23° C., and RIE power of 100 W-500 W.

The fabrication method 50 includes forming metal contacts 124-126 and metal plugs 128-130 in via contact holes 120-122 to produce IC structure 82 of FIG. 17 (step 65). Forming the metal contacts 128-130 includes performing an e-beam evaporation deposition of metal and a conventional liftoff of excess metal. The metal contact 125 to p-type extrinsic portion 109 of the base has a bottom-to-top layer structure of either about 50 Å of palladium (Pd)/about 400 Å of platinum (Pt)/about 2,000 Å of Au or about 50 Å of Ti/about 400 Å of Pt/about 2,000 Å of Au. The metal contacts 124, 126 to n-type extrinsic emitter 117 and semiconductor subcollector contact 118 have a bottom-to-top layer structure of about 50 Å of AuGe/about 400 Å of Pt/about 2,000 Å of Au. The RTA and the differing multilayer metallic contact structures are configured to reduce contact resistances to the underlying semiconductor layers.

The method 50 also includes depositing metallization layers, additional protective dielectric layers, and metallic contact pads according to methods well known to those of skill in the art.

EXAMPLE 2

Figure 10:
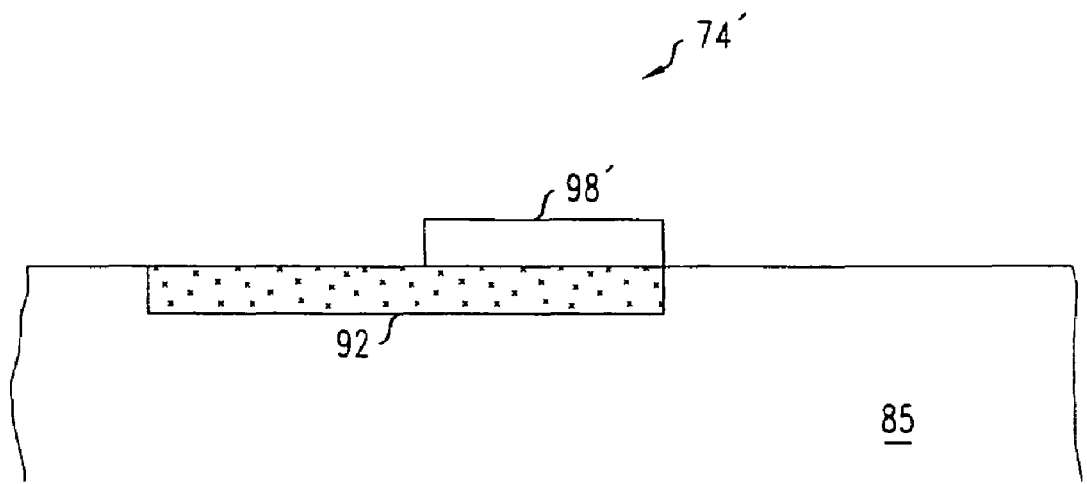
FIG. 10 is a cross-sectional view of an intermediate structure with an alternate collector layer formed according to a method similar to the method of FIG. 4.

An alternate fabrication method involves performing steps 51-52 and 54-65 as described with respect to FIG. 4 and performing a replacement step for collector layer forming step 53 of method 50. The replacement step involves selectively growing n-type InP for collector layer 98' to produce alternate intermediate structure 74' of FIG. 10. The replacement step includes forming a $SiO_2$ mask by performing a PECVD of about 2000 Å of $SiO_2$, forming a photoresist mask on the $SiO_2$, wet etching the $SiO_2$ with the above-described aqueous HF solution to produce a window over subcollector 92, and RIE stripping the photoresist. The replacement step also includes performing a MOMBE growth of n-type InP under conditions that cause the selective growth on InP substrate 85 and not on the SiO$_2$ mask. The MOMBE conditions include: a dopant density of $2 \times 10^{16}$-$8 \times 10^{17}$ tin (Sn) atoms per cm$^3$ and preferably about $1 \times 10^{17}$ Sn atoms per cm$^3$, a substrate temperature of 400° C.-500° C., a Sn effusion cell temperature of 600° C.-900° C., a TMIn flow rate of between 1 sccm and 10 sccm, a PH$_3$ flow rate of between 1 sccm and 10 sccm, and a chamber background pressure between $10^{-9}$ and $10^{-6}$ Torr.

The MOMBE growth is stopped when n-type InP collector layer 98' has a thickness of 1,500 Å-2,500 Å. After the MOMBE growth, a wash with the same aqueous HF solution removes the SiO$_2$ mask thereby producing structure 74' of FIG. 10. The resulting collector layer 98' has a limited lateral extent, which produces a nontrivial cross-sectional profile.

EXAMPLE 3

An alternate fabrication method also includes performing steps 51-52 and 54-65 as described with respect to FIG. 4 and performing a replacement step for collector layer forming step 53 of method 50. The replacement step includes non-selectively growing a blanket layer of n-type InP as in step 53 and then etching an annular trench in the n-type InP layer (not shown) to laterally separate active collector 98 from adjacent devices on InP substrate 85. The fabrication of the annular isolation trench includes performing a dry or wet etch of the blanket InP layer under control of a photoresist mask made by I-line stepper lithography. Typical ICP dry etch conditions include: a process pressure of 2-10 mTorr, a total gas flow rate of 10 sccm-50 sccm of a gas mixture of BCl$_3$, Cl$_2$, Ar, and N$_2$, an RIE power of 20 W-130 W, an ICP power of 200 W-800 W, and a substrate temperature of 0° C.-30° C. After forming the trench, an oxygen RIE followed by immersion in NMP or PRS-1000 strips away the photoresist mask.

EXAMPLE 4

Another alternate fabrication method includes performing steps 51-52 and 54-65 as described with respect to FIG. 4 and performing another replacement step for collector layer forming step 53 of method 50. The replacement step involves producing electrical isolation barrier 99 of FIG. 9 by performing a damaging ion implantation of iron (Fe) in the initial n-type InP layer. Exemplary Fe-based damage implantations are described in U.S. patent application Ser. No. 10/243,369, filed Sep. 13, 2002 by Young-Kai Chen et al, which is incorporated herein by reference in its entirety.

Various embodiments use different semiconductors for the substrate, collector, base, and/or emitter layers. Exemplary other semiconductors for these layers include AlGaAs, AlGaN, Si, or InGaP for the emitter; GaAs, InGaAs, SiC, SiGe, or InGaN for the base; and AlGaAs, AlGaN, GaN, SiC, Si, or GaAs for the collector.

Various other embodiments have an active semiconductor layer stack with a reversed order. In the reversed order, the collector layer is the vertically top most semiconductor layer, i.e., the semiconductor layer farthest from the substrate on which the bipolar transistor rests.

From the disclosure, drawings, and claims, other embodiments of the invention will be apparent to those skilled in the art.

What is claimed is:

1. An integrated circuit, comprising:
   a substrate having a top surface;
   collector, base, and emitter semiconductor layers of a bipolar transistor, the semiconductor layers forming a vertical sequence on the substrate in which intrinsic portions of two of the semiconductor layers are sandwiched between the top surface of the substrate and a remaining top one of the semiconductor layers, the base layer comprising an extrinsic portion that laterally encircles a vertical portion of the top one of the semiconductor layers; and
   a dielectric sidewall being interposed between the vertical portion of the top one of the semiconductor layers and the extrinsic portion of the base layer; and
   wherein the substrate includes a subcollector that forms an electrical contact for the collector layer, the entire subcollector being located outside of the portion of the substrate that is vertically below part of the base layer.

2. The integrated circuit of claim 1, wherein the extrinsic portion of the base layer extends farther away from the substrate than an interface between the top one of the semiconductor layers and the base layer.

3. The integrated circuit of claim 1, wherein a part of the extrinsic portion of the base layer is located between the substrate and an extrinsic portion of the top one of the semiconductor layers.

4. The integrated circuit of claim 3, further comprising a dielectric layer, a portion of the dielectric layer being located on the extrinsic portion of the base layer and the extrinsic portion of the top one of the semiconductor layers being located on the dielectric layer.

5. The integrated circuit of claim 3, wherein the extrinsic portion of the base layer extends farther away from the substrate than an interface between the top one of the semiconductor layers and the base layer.

6. The integrated circuit of claim 5, further comprising a dielectric layer, a portion of the dielectric layer being located on the part of the extrinsic portion of the base layer and the extrinsic portion of the top one of the semiconductor layers being located on the dielectric layer.

7. The integrated circuit of claim 3, wherein the dielectric sidewall has a thickness of 500 to 1500 angstroms.

8. The integrated circuit of claim 1, wherein the top one of the collector, base, and emitter semiconductor layers is epitaxially grown.

9. The integrated circuit of claim 1, wherein the top one of the collector, base, and emitter semiconductor layers is a graded layer.

10. The integrated circuit of claim 1, wherein the top one of the collector, base, and emitter semiconductor layers includes gallium.

11. The integrated circuit of claim 1, wherein the top one of the collector, base, and emitter semiconductor layers includes an InP layer.

12. The integrated circuit of claim 1, wherein the base layer comprises gallium.

13. The integrated circuit of claim 1, wherein the base layer comprises gallium, indium and arsenic.

14. The integrated circuit of claim 1, wherein the substrate is an InP substrate.

* * * * *